US005682066A

United States Patent [19]
Gamota et al.

[11] Patent Number: 5,682,066
[45] Date of Patent: Oct. 28, 1997

[54] MICROELECTRONIC ASSEMBLY INCLUDING A TRANSPARENT ENCAPSULANT

[75] Inventors: Daniel Roman Gamota, Palatine; Alan G. Chen, Schaumburg; Michael Hertsberg, Northbrook, all of Ill.

[73] Assignee: Motorola, Inc., Schaumburg, Ill.

[21] Appl. No.: 689,585

[22] Filed: Aug. 12, 1996

[51] Int. Cl.⁶ .......................... H01L 23/48; H01L 23/52; H01L 29/40
[52] U.S. Cl. .................. 257/783; 257/782; 257/787; 257/789; 257/795
[58] Field of Search .................. 257/782, 783, 257/787, 789, 795, 788; 437/207, 211, 219, 224

[56] References Cited

U.S. PATENT DOCUMENTS

| | | |
|---|---|---|
| 4,888,634 | 12/1989 | Lai et al. ................ 257/795 |
| 5,001,542 | 3/1991 | Tsukagoshi et al. ........ 257/783 |
| 5,089,440 | 2/1992 | Christie et al. . |
| 5,113,241 | 5/1992 | Yanagida et al. .......... 257/783 |
| 5,120,678 | 6/1992 | Moore et al. . |
| 5,121,190 | 6/1992 | Hsiao et al. . |
| 5,128,746 | 7/1992 | Pennisi et al. . |
| 5,136,365 | 8/1992 | Pennisi et al. ............ 257/788 |
| 5,218,234 | 6/1993 | Thompson et al. . |
| 5,317,191 | 5/1994 | Abe ...................... 257/783 |
| 5,483,106 | 1/1996 | Echigo et al. ............. 257/795 |

*Primary Examiner*—Carl W. Whitehead, Jr.
*Assistant Examiner*—S. V. Clark
*Attorney, Agent, or Firm*—John B. MacIntyre; Douglas D. Fekete

[57] ABSTRACT

A microelectronic assembly (10) includes an integrated circuit die (12) mounted onto a substrate (14) and spaced apart by a gap (30). Solder bump interconnections (32) extend across the gap (30) and physically attach and electrically connect an electrical circuit on the substrate (14) to an electrical circuit on the integrated circuit die (12). The gap (30) is filled with a transparent encapsulant (16) to protect the solder bump interconnections (32). The transparent encapsulant (16) is composed of a polymeric matrix and filler particles dispersed in the matrix. The polymeric matrix and the filler particles have substantially similar indices of refraction, thereby making the encapsulant (16) transparent. The integrated circuit die (12) includes light emitting diodes (18) that transmit light toward the transparent substrate (14) to form a display. The substrate (12) is preferably formed of transparent glass, and the filler particles are preferably formed of a composition similar to the transparent glass substrate (14) to allow light generated by the light emitting diodes (18) to pass through the encapsulant (16) and the substrate (14).

17 Claims, 1 Drawing Sheet

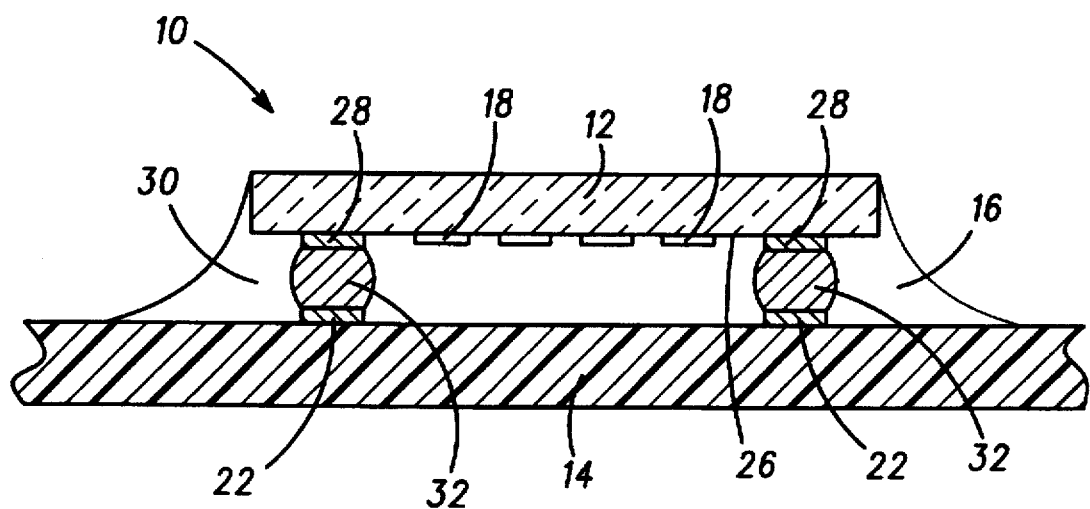

5,682,066

MICROELECTRONIC ASSEMBLY INCLUDING A TRANSPARENT ENCAPSULANT

FIELD OF THE INVENTION

This invention relates generally to a microelectronic assembly in which an integrated circuit die is spaced apart from a substrate by a gap that is filled with an encapsulant. More particularly, this invention relates to such a microelectronic assembly wherein the encapsulant is transparent.

BACKGROUND OF THE INVENTION

It is known to form a microelectronic assembly by a direct chip attach method, commonly referred to as flip chip, wherein an integrated circuit die is mounted directly onto a substrate by solder bump interconnections. The integrated circuit die is spaced apart from the substrate by a gap, and the solder bump interconnections extend across the gap and connect bond pads on the integrated circuit die to bond pads on the substrate. In this manner, the integrated circuit die is attached to the substrate, and electrical signals are conducted to and from the die for processing.

In order to protect the solder bump interconnections, the gap is typically filled with an encapsulant. Encapsulants are typically formed of a thermoset matrix and inorganic particulate filler disperse within the matrix. Typical underfilling encapsulant are opaque; and commonly used underfilling encapsulants include carbon powder to further block light from traversing the encapsulant.

Integrated circuit die can include light emitting diodes that are effective in emitting signals, for instance to form images or a display. These signals, in order to be accurately received, cannot be scattered prior to reaching their desired destination. Consequently, the signals cannot be accurately transmitted through an opaque encapsulant, and in particular an encapsulant that includes carbon powder dispersed in the polymeric matrix.

Therefore, a need exists for an underfilling encapsulant that provides enhanced mechanical support for the assembly and in particular the solder bump interconnections while allowing signals generated by a light emitting diode to be transmitted through the encapsulant.

BRIEF DESCRIPTION OF THE DRAWINGS

The drawing is a cross-sectional view of a microelectronic assembly in accordance with a preferred embodiment of the present invention.

BRIEF DESCRIPTION OF A PREFERRED EMBODIMENT

The present invention provides a microelectronic assembly in which an integrated circuit die is spaced apart from a substrate, such as a transparent glass substrate, by a gap and attached to the substrate by solder bump interconnections that extend across the gap. The solder bump interconnections physically attach and electrically connect an electrical circuit on the substrate to an electrical circuit on the integrated circuit die for conducting electrical signals to and from the die for processing. A transparent encapsulant is disposed within the gap to protect the solder bump interconnections. For purposes of this invention, transparent refers to elements that transmit at least 90% of normal, incident light that is within the visible spectrum. The encapsulant is composed of a polymeric matrix, preferably an epoxy matrix, and filler particles dispersed in the matrix. The polymeric matrix and the filler particles have substantially similar indices of refraction, thereby making the encapsulant transparent. In a preferred embodiment, the substrate is formed of transparent glass and the integrated circuit die includes light emitting diodes that transmit light through the transparent encapsulant and the transparent substrate to form a display. The filler particles are preferably formed of a composition similar to the transparent glass substrate to allow light generated by the light emitting diodes to pass through the encapsulant and the substrate.

A preferred embodiment of the present invention can be better understood with reference to the drawing. In accordance with a preferred embodiment of this invention, a preassembly is formed that comprises an integrated circuit die 12 mounted by a flip-chip process onto a substrate 14. Integrated circuit die 12 is preferably formed of gallium arsenide and comprises an active face 26 that faces substrate 14. Integrated circuit die 12 can alternately be formed of silicon. Active face 26 is generally planar and is parallel to substrate 14 and includes a plurality of light emitting diodes 18. Light emitting diodes 18 are effective in transmitting light signals toward substrate 14 to form a display, and are preferably formed in an array on active face 26 in the central region of integrated circuit die 12. In a preferred embodiment, light emitting diodes 18 transmit red light having a wavelength between about 635 and 660 nm.

Integrated circuit die 12 comprises die bond pads 28 disposed on active face 26 to facilitate electrical connection to circuits (not shown) on die 12. Die bond pads 28 are preferably disposed on the perimeter region of active face 26, outboard of light emitting diodes 18, and are composed of a solder-wettable metal, preferably aluminum coated with a layer of chromium, which is in turn coated with a layer of copper. Solder bumps are disposed on die bond pads 28 and are preferably formed of a tin-lead solder having a composition near eutectic tin-lead alloy, formed of about 63 weight percent tin and the balance substantially lead and having a melting temperature of about 183° C.

Substrate 14 is formed of a transparent material, preferably glass, that is effective to pass light generated by die 12. Substrate 14 can alternately be formed of transparent plastic. Substrate bond pads 22 are disposed on substrate 14 and are preferably composed of a layer of indium-tin-oxide that is coated with a layer of chromium, which is coated with a layer of copper, which is coated with a layer of solder-wettable material, preferably nickel/gold. Substrate bond pads 22 are formed in a pattern matching die bond pads 28. A transparent region is formed in substrate 14 inboard of substrate bond pads 22 that aligns with the array of light emitting diodes 18 when integrated circuit die 12 is superposed onto substrate 14.

In accordance with a preferred embodiment of the present invention, integrated circuit die 12 is arranged to overlie substrate 14 such that each of the die bond pads 28 registers with a substrate bond pad 22. The arrangement is heated to a temperature, suitably between about 183° C. and about 220° C., sufficient to reflow the eutectic solder on bond pads 28 to wet die bond pads 28. Thereafter, the arrangement is cooled to solidify the solder to form solder bump interconnections 32. Solder bump interconnections 32 extend across gap 30, which is formed between active face 26 and substrate 14. By way of an example, gap 30 has a height between about 25 and 150 microns. Solder bump interconnections 32 are effective in electrically and mechanically connecting die bond pads 28 to substrate bond pads 22.

In order to enhance the reliability of the preassembly, it is desired to dispose an encapsulant within gap 30. To form the encapsulant, integrated circuit die 12 is underfilled with a precursor. In accordance with a preferred embodiment of the present invention, the precursor is composed of a flowable mixture comprising fine inorganic particles dispersed in a polymeric precursor that is formulated to produce a resinous matrix, preferably an epoxy-base resin. The epoxy-base resin has a first index of refraction of between about 1.50 and 1.56. A preferred epoxy-base formulation includes a hardener, a catalyst, an adhesion promoter, and inorganic particles added as a filler. The hardener is suitably an anhydride formulation, such as a cyclic anhydride, and is preferably methyltetrahydrophthalic anhydride. The hardener reacts with the epoxy precursor during curing. The ratio of the epoxy resin to the hardener is about 3:1. The catalyst, suitably 2-phenylimidazole, promotes reaction of the constituents during curing. In a preferred embodiment, a blue die is added to the epoxy-base formulation to compensate for the yellow tint of the preferred catalyst. The adhesion promoter is preferably aminosilane, and enhances wetting of substrate 14 to promote adhesion of the resultant encapsulant. A preferred precursor is composed of about 20 to 30 weight percent epoxy prepolymer, about 3 to 10 weight percent hardener, about 0.1 to 1.0 weight percent catalyst, about 0.01 to 0.10 weight percent adhesion promoter, with the balance being substantially ground glass filler. The curable material formulation can be modified to produce a polymer with desired characteristics, such as a desired cure time, cure temperature, and thermal expansion properties.

The filler is formed of inorganic particles, such as ground glass particles, having a second index of refraction substantially similar to the first index of refraction of the epoxy matrix. As an example, the second index of refraction is between about 1.49 and 1.52. By substantially matching the indices of refraction, a transparent encapsulant will be formed upon curing. The glass filler particles are suitably formed by grinding a glass material in a ball mill to achieve the desired sized particles. In a preferred embodiment, the filler is composed of borosilicate glass particles having an average size of between about 5 and 35 microns, the sizes being average agglomerate sizes as measured by conventional laser scattering techniques. In an alternate embodiment, the particles have an average size less than 0.1 micron.

As an example of a preferred method of forming microelectronic assembly 10, the precursor is dispensed onto substrate 14 adjacent to integrated circuit die 12. The precursor is preferably dispensed in a bead on two adjacent sides of integrated circuit die 12 using a syringe or the like. Prior to dispensing the precursor, substrate 14 is preheated to a temperature, preferably about 75° C., lower than the cure temperature of the precursor, to lower the viscosity and enhance the flowability of the precursor. The precursor is then drawn into gap 30 by capillary action.

The preassembly is heated to cure the precursor to form encapsulant 16. The precursor is cured by heating to a temperature sufficient to cross-link the epoxy-base prepolymer. A suitable cure schedule for the preferred epoxy-base resin is between 30 and 120 minutes at a temperature between about 120° and 175° C. The cure temperature should be less than the reflow temperature of solder bump interconnections 32 to ensure that the solder bumps do not reflow during the curing step. By way of an example of a preferred embodiment, the curing is done at about 150° C. for about 30 minutes.

In an alternate embodiment, a precursor including glass particles dispersed in an epoxy-base prepolymer is dispensed onto substrate 14. Integrated circuit die 12 is positioned onto substrate 14 such that each of the die bond pads 28 extends through the precursor and registers with a substrate bond pad 22. The arrangement is heated to a temperature, suitably between about 183° C. and about 220° C., sufficient to reflow the eutectic solder on bond pads 28 and to cure the precursor to form a transparent encapsulant 16. Thereafter, the arrangement is cooled to solidify the solder to form solder bump interconnections 32 that extend across gap 30 formed between die 12 and substrate 14.

Thus, the product microelectronic assembly 10 includes integrated circuit die 12 overlying and spaced apart from substrate 14 by gap 30. Integrated circuit die 12 includes light emitting diodes 18 that are effective in transmitting light signals toward substrate 14. Transparent encapsulant 16 is disposed within gap 30 to provide enhanced mechanical support for solder bump interconnections 32 and allows the signals generated by light emitting diodes 18 to pass through to transparent substrate 14. The light signals pass through substrate 14 to form a display opposite integrated circuit die 12.

In this manner, a microelectronic assembly is formed that includes a transparent encapsulant interposed between an integrated circuit die and a transparent substrate. The transparent encapsulant provides enhanced mechanical support for the assembly while allowing light emitting diodes on the integrated circuit die to effectively transmit light through the encapsulant and the transparent substrate to form a well-lit, easily viewable display.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A microelectronic assembly comprising:
   a substrate;
   an integrated circuit die overlying the substrate and spaced apart therefrom by a gap;
   a plurality of solder bump interconnections that extend across the gap and connect the integrated circuit die to the substrate; and
   a transparent encapsulant disposed within the gap and composed of a polymeric matrix and filler particles dispersed within the polymeric matrix, said polymeric matrix having a first index of refraction, said filler particles having a second index of refraction substantially similar to the first index of refraction.

2. A microelectronic assembly in accordance with claim 1, wherein the integrated circuit die comprises an active face that faces the substrate and a plurality of light emitting diodes disposed on the active face and adapted to emit light toward the substrate.

3. A microelectronic assembly in accordance with claim 1, wherein the substrate is composed of transparent glass.

4. A microelectronic assembly in accordance with claim 3, wherein the filler particles are composed of ground particles formed from a composition similar to the transparent glass.

5. A microelectronic assembly in accordance with claim 1, wherein the polymeric matrix is an epoxy-base resin.

6. A microelectronic assembly in accordance with claim 1, wherein the substrate has an index of refraction approximately equal to the index of refraction of the transparent encapsulant.

7. A microelectronic assembly comprising:
   a substrate formed of a transparent material and having a transparent region;

an integrated circuit die overlying the substrate and spaced apart therefrom by a gap;

a plurality of solder bump interconnections that extend across the gap and connect the integrated circuit die to the substrate; and a transparent encapsulant disposed within the gap and composed of an epoxy matrix and filler particles dispersed within the polymeric matrix, said epoxy matrix having a first index of refraction, said filler particles formed of ground glass and having a second index of refraction substantially similar to the first index of refraction, such that the encapsulant is transparent.

8. A microelectronic assembly in accordance with claim 7, wherein the filler particles are composed of borosilicate glass particles.

9. A microelectronic assembly in accordance with claim 7, wherein the integrated circuit die comprises an active face that faces the substrate and a plurality of light emitting diodes disposed on the active face and adapted to emit light toward the substrate.

10. A microelectronic assembly in accordance with claim 9, wherein the filler particles are composed of ground particles formed from a composition similar to the transparent glass.

11. A microelectronic assembly in accordance with claim 7, wherein the substrate has an index of refraction approximately equal to the index of refraction of the transparent encapsulant.

12. A microelectronic assembly comprising:

a transparent glass substrate;

an integrated circuit die overlying the transparent glass substrate and spaced apart therefrom by a gap, said integrated circuit die comprising an active face that faces the transparent glass substrate and a plurality of light emitting diodes disposed on the active face and adapted to emit light toward the transparent glass substrate;

a plurality of solder bump interconnections that extend across the gap and connect the integrated circuit die to the transparent glass substrate; and a transparent encapsulant disposed within the gap and composed of an epoxy matrix and filler particles dispersed within the polymeric matrix, said epoxy matrix having a first index of refraction, said filler particles formed of ground glass and having a second index of refraction substantially similar to the first index of refraction, such that the encapsulant is transparent.

13. A microelectronic assembly in accordance with claim 12, wherein the filler particles are composed of ground particles formed from a composition similar to the transparent glass substrate.

14. A microelectronic assembly in accordance with claim 12, wherein the filler particles have a diameter between about 5 and 35 microns.

15. A microelectronic assembly in accordance with claim 12, wherein the filler particles have a diameter less than about 0.1 micron.

16. A microelectronic assembly in accordance with claim 12, wherein the first index of refraction is between about 1.50 and 1.56, and wherein the second index of refraction is between about 1.49 and 1.52.

17. A method for forming a microelectronic assembly comprising:

fabricating a glass substrate comprising substrate bond pads coated with a layer of solder;

positioning an integrated circuit die onto the substrate, said integrated circuit die comprising a plurality of die bond pads that extend through the precursor and register with the substrate bond pads;

reflowing the solder about the die bond pads;

dispensing a precursor comprising glass particles dispersed in an epoxy-base prepolymer onto the glass substrate about the substrate bond pads; and curing the precursor to form an encapsulant, said epoxy-base prepolymer having a first index of refraction, said glass particles having a second index of refraction substantially similar to the first index of refraction, thereby making the encapsulant transparent.

* * * * *